US009864713B2

(12) United States Patent
Benjamin et al.

(10) Patent No.: US 9,864,713 B2
(45) Date of Patent: Jan. 9, 2018

(54) OPTIMAL SAMPLING OF DATA-BUS SIGNALS USING CONFIGURABLE INDIVIDUAL TIME DELAYS

(71) Applicant: Marvell Israel (M.I.S.L) Ltd., Yokneam (IL)

(72) Inventors: Ofer Benjamin, Haifa (IL); Eldad Bar-Lev, Kiryat Tivon (IL)

(73) Assignee: MARVELL ISRAEL (M.I.S.L.) LTD., Yokneam (IL)

( * ) Notice: Subject to any disclaimer, the term of this patent is extended or adjusted under 35 U.S.C. 154(b) by 174 days.

(21) Appl. No.: 14/957,617

(22) Filed: Dec. 3, 2015

(65) Prior Publication Data

US 2016/0162426 A1  Jun. 9, 2016

Related U.S. Application Data

(60) Provisional application No. 62/088,033, filed on Dec. 5, 2014, provisional application No. 62/088,860, filed on Dec. 8, 2014, provisional application No. 62/088,876, filed on Dec. 8, 2014, provisional application No. 62/088,891, filed on Dec. 8, 2014, provisional application No. 62/088,911, filed on Dec. 8, 2014.

(51) Int. Cl.
G06F 13/00 (2006.01)
H04L 12/00 (2006.01)
G06F 3/00 (2006.01)
G06F 13/362 (2006.01)
G06F 13/40 (2006.01)

(52) U.S. Cl.
CPC ...... *G06F 13/3625* (2013.01); *G06F 13/4031* (2013.01); *G06F 13/4054* (2013.01)

(58) Field of Classification Search
None
See application file for complete search history.

(56) References Cited

U.S. PATENT DOCUMENTS

| | | | | |
|---|---|---|---|---|
| 6,549,596 B1 * | 4/2003 | Cretti | ................... | H04L 7/0337 375/327 |
| 2006/0052961 A1 * | 3/2006 | Best | ................... | G06F 13/1689 702/106 |
| 2009/0006776 A1 * | 1/2009 | Spry | ................... | G06F 13/1689 711/154 |
| 2009/0296501 A1 * | 12/2009 | Searles | ............... | G06F 13/1689 365/193 |
| 2016/0111139 A1 * | 4/2016 | Choksey | .............. | G11C 11/4063 365/189.02 |
| 2016/0133305 A1 * | 5/2016 | Magee | ................... | G11C 7/222 365/189.02 |
| 2016/0162426 A1 * | 6/2016 | Benjamin | ........... | G06F 13/3625 710/118 |

OTHER PUBLICATIONS

JEDEC Standard JESD79-4A, entitled "DDR4 SDRAM," 218 pages, Nov. 2013.

* cited by examiner

*Primary Examiner* — David E Martinez

(57) ABSTRACT

A method includes receiving a group of logic signals to be sampled at a common sampling timing. Individual time delays, which individually align each of the logic signals to the common sampling timing, are selected for the respective logic signals in the group. Each of the logic signals is delayed by the respective selected individual time delay, and the entire group of the delayed logic signals is sampled at the common sampling timing.

14 Claims, 6 Drawing Sheets

```
     #####0123456789##############################
DQ0  111111111111111111111110000001111111111111111
DQ1  11111111000000000000000000000000001111111111
DQ2  11111111111111111110000000011111111111111111
DQ3  11111111111111100000000000111111111111111111
DQ4  1111111111111111110000000000000000000000111111
DQ5  111111111111111000000000000000001111111111111
DQ6  1111111100000000000000000000000000000001111111
DQ7  1111111111111111111000000000000000001111111111
```

```
     #####0123456789##############################
DQ0  111111111111111110000001111111111111111111111
DQ1  1111111000000000000000000000000000111111111111
DQ2  11111111111111110000000011111111111111111111
DQ3  11111111111111110000000000111111111111111111
DQ4  111111110000000000000000000011111111111111111
DQ5  1111111111000000000000000001111111111111111111
DQ6  1111100000000000000000000000000001111111111111
DQ7  111111111110000000000000000011111111111111111
```

46

OPTIMAL SAMPLING OF DATA-BUS SIGNALS USING CONFIGURABLE INDIVIDUAL TIME DELAYS

CROSS-REFERENCE TO RELATED APPLICATIONS

This application claims the benefit of U.S. Provisional Patent Application 62/088,033, filed Dec. 5, 2014, U.S. Provisional Patent Application 62/088,860, filed Dec. 8, 2014, U.S. Provisional Patent Application 62/088,876, filed Dec. 8, 2014, U.S. Provisional Patent Application 62/088,891, filed Dec. 8, 2014, and U.S. Provisional Patent Application 62/088,911, filed Dec. 8, 2014, whose disclosures are incorporated herein by reference.

FIELD OF THE DISCLOSURE

The present disclosure relates generally to bus interfaces, and particularly to methods and devices for compensating for timing skew in bus-interface signals.

BACKGROUND

Data bus interfaces are used for exchanging data in a wide variety of electronic devices, such as processors and memory devices. For example, Synchronous Dynamic Random Access Memory (SDRAM) devices use a parallel data bus having, among other signals, data (DQ) and data-strobe (DQS) signals. Various types of SDRAM devices and respective bus interfaces are in common use. For example, the JEDEC Solid State Technology Association has specified Double Data Rate Fourth Generation (DDR4) SDRAM devices, in JEDEC Standard JESD79-4A, entitled "DDR4 SDRAM," November, 2013, which is incorporated herein by reference.

The description above is presented as a general overview of related art in this field and should not be construed as an admission that any of the information it contains constitutes prior art against the present patent application.

SUMMARY

An embodiment that is described herein provides a method including receiving a group of logic signals to be sampled at a common sampling timing. Individual time delays, which individually align each of the logic signals to the common sampling timing, are selected for the respective logic signals in the group. Each of the logic signals is delayed by the respective selected individual time delay, and the entire group of the delayed logic signals is sampled at the common sampling timing.

In some embodiments, selecting the individual time delays includes identifying for each logic signal a respective timing window during which the logic signal is valid, and selecting the individual time delays based on the timing windows identified for the logic signals. In an example embodiment, selecting the individual time delays includes centering each of the timing windows on the common sampling timing.

In a disclosed embodiment, selecting the individual time delays includes, in response to detecting that it is impossible to center all the timing windows on the common sampling timing, choosing the common sampling timing and the individual time delays such that (i) the timing windows overlap the common sampling timing and (ii) the common sampling timing separated from edges of the timing windows by at least a predefined time margin. In an embodiment, selecting the individual time delays includes choosing the common sampling timing and the individual time delays such that the timing windows overlap the common sampling timing.

In some embodiments, delaying the logic signals is performed by configurable delay elements having a finite delay range, and selecting the individual time delays includes ascertaining that the individual time delays are all within the finite delay range. In an embodiment, selecting the individual time delays includes identifying, for a set of possible supply voltages, respective timing windows during which at least a predefined number of the logic signals are valid, and setting the individual time delays so as to position the common sampling timing at a centroid of a two-dimensional region formed by the timing windows in a voltage-timing plane.

In an embodiment, receiving the logic signals includes receiving data (DQ) signals from a memory device. In an embodiment, receiving the logic signals includes receiving at least one data strobe (DQS) signal from the memory device.

There is additionally provided, in accordance with an embodiment that is described herein, an apparatus including a calibrator and a sampler. The calibrator is configured to receive a group of logic signals to be sampled at a common sampling timing, to select for the logic signals in the group respective individual time delays that individually align each of the logic signals to the common sampling timing, and to delay each of the logic signals by the respective selected individual time delay. The sampler is configured to sample the entire group of the delayed logic signals at the common sampling timing.

The present disclosure will be more fully understood from the following detailed description of the embodiments thereof, taken together with the drawings in which:

DETAILED DESCRIPTION OF EMBODIMENTS

Figure 1:
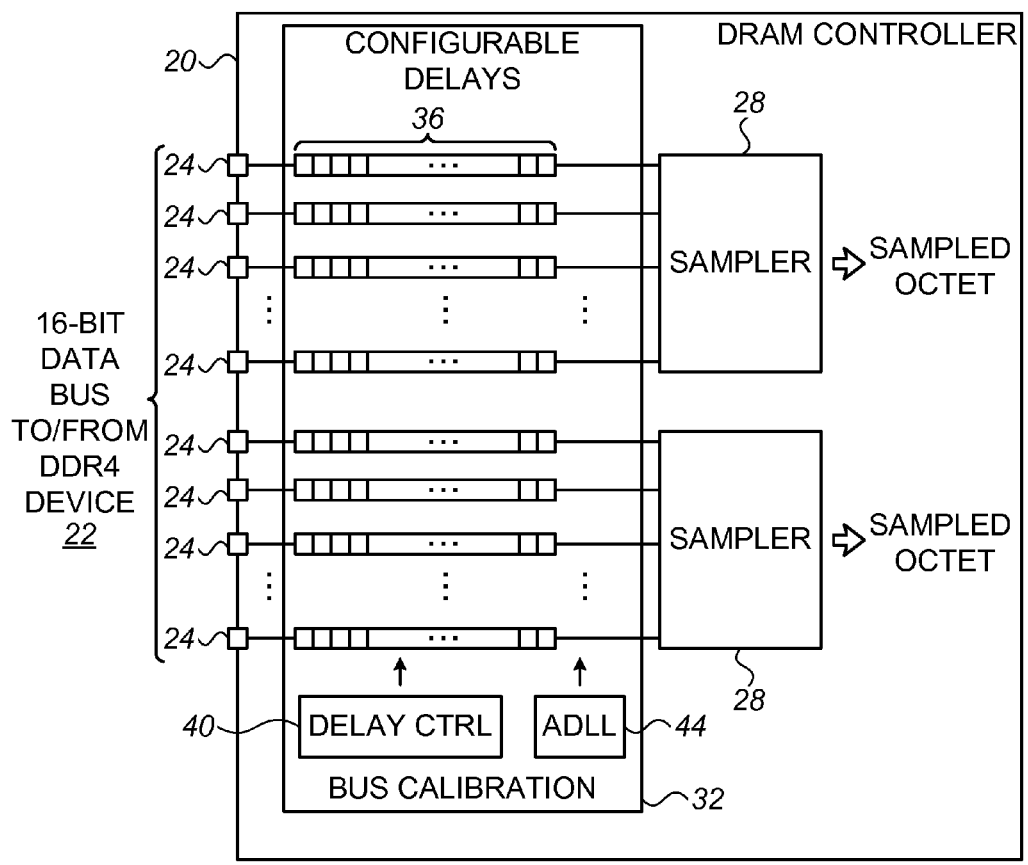
FIG. 1 is a block diagram that schematically illustrates a Dynamic Random Access Memory (DRAM) controller, in accordance with an embodiment that is described herein.

In some electronic devices, multiple signals of a bus are sampled jointly at the sample sampling timing. For example, the data bus of DDR4 memory devices is divided into groups of eight signals referred to as octets, and the signals of each octet are sampled using a single sampler with the same bit timing.

In practice, however, different bus signals may differ in timing skew from one another, e.g., due to different routing inside the device package or on Printed Circuit Board (PCB) traces, due to process variations in the device or PCB manufacturing, due to voltage or temperature variations, or for any other reason. It is possible in principle to sample such signals with the same sampling timing, but at the cost of degraded signal integrity and/or severe restrictions on PCB layout.

Embodiments that are described herein provide methods and devices for sampling bus signals, while compensating for individual timing skews that differ from one signal to another. In some embodiments, a DRAM controller communicates with a DDR4 memory device over a data bus that is divided into octets as described above. The DRAM controller comprises a bus calibration module that is configured to delay the signals in a given octet by respective individual delays that are selected independently per signal.

In an embodiment, the bus calibration module comprises multiple configurable delay elements, one for each signal, and a delay control module that calculates the appropriate delay for each signal and configures the delay elements accordingly. The delay control module typically sets the delays so as to align the signals of each octet to a single common sampling timing. The octet is then sampled using a single sampler at the common sampling timing set by the delay control module. When the bus comprises multiple octet, each octet is processed as described above and sampled using a single respective sampler.

Various methods for finding the preferred common sampling timing are described herein. In an example method, the delay control module finds the "valid timing window" of each signal in the octet, i.e., the range of delays for which the signal will be sampled correctly. The delay control module first attempts to find a set of delays that will center all eight valid timing windows on the same sampling point. This criterion is referred to as a "centering criterion."

Centering all eight valid timing windows in this manner is not always possible, due to the finite range of delays of the configurable delay elements. If centering the timing windows is found to be impossible, the delay control module attempts to find a set of delays that at least makes the eight signals overlap a single sampling point. This criterion is referred to as an "overlap criterion." If the overlap criterion cannot be met, the delay control module concludes that it is impossible to align all eight signals to a single sampling point, and declares failure.

In some embodiments, before reverting to the overlap criterion, the delay control module attempts to meet a "relaxed centering criterion" in which the eight signals overlap a single sampling point, and the single sampling point is separated by at least a certain time margin from the edges of all valid timing windows.

In some embodiments, the delay control module also considers variations in the positions of the valid timing windows caused by variations in supply voltage (e.g., in the reference voltage of the sampler). In an example embodiment, the delay control module calculates a respective set of individual delays as described above, per voltage. The delay control module then identifies the voltage-timing combinations in which the entire octet is sampled correctly. These voltage-timing combinations define a two-dimensional (2-D) region (e.g., polygon) in the voltage-timing plane. The delay control module calculates the centroid ("center-of-mass") of this region, and uses the timing of the centroid as the preferred common sampling point.

In summary, the methods and devices described herein compensate for individual timing skews that differ from one data-bus signal to another. The delay-compensated signals can then be sampled with a single sampling timing, without compromising signal integrity. Since sampling is no longer sensitive to individual variations in timing skew, the disclosed techniques relax the timing constraints imposed on package design and circuit layout.

FIG. 1 is a block diagram that schematically illustrates a Dynamic Random Access Memory (DRAM) controller 20, in accordance with an embodiment that is described herein. In the present example, DRAM controller 20 controls a Double Data Rate Fourth Generation (DDR4) DRAM memory device (not shown in the figure). Among other tasks, the DRAM controller writes and reads data to and from the memory device via a data bus 22 having multiple lines 24 that convey respective logic signals.

In an embodiment, the logic signals comprise, for example, data (DQ) signals and/or data strobe (DQS) signals. In the description that follows, the terms "signal lines" (referring to the physical lines of the bus) and "logic signals" (referring to the electrical signals conveyed by the signal lines) are used interchangeably. Typically although not necessarily, the DQ signals are single-ended signals and the DQS signals are differential signals.

Although the embodiments described herein refer mainly to the DDR4 data bus, the disclosed techniques are applicable to any other suitable type of bus interface that is used for connecting any other suitable electronic devices. FIG. 1 shows a single data bus used for controlling a single memory device, for the sake of clarity. Generally, DRAM controller 20 may control multiple memory devices and/or comprise multiple data buses.

When DRAM controller 20 operates in a host system, the logic signals of bus 22 are typically subject to timing skew. Skew may be static and/or dynamic. The term "static skew" refers to a variation in signal timing that affects an entire set of signals and changes from one product to another, but not between signals. The term "dynamic skew" (also referred to as jitter) refers to differences in signal timing between different signals of bus 22, and may or may not vary over time, e.g., due to voltage or temperature variations. Skew may be affected, for example, by signal propagation time in the interconnections between the DRAM controller and the memory device (e.g., board circuit traces) or in the package of the DRAM controller or memory device, or by any other factor.

In accordance with the DDR4 specification, signals 24 of bus 22 are divided into groups of eight signals referred to as octets. The example of FIG. 1 shows a 16-bit data bus comprising two octets. In alternative embodiments, bus 22 may comprise, for example, an 8-bit bus having a single octet, a 32-bit bus having four octets, or a bus having any other suitable bus width.

The eight signals of each octet are sampled by a single respective sampler 28. The eight signals provided to a given sampler are sampled simultaneously, with the same sampling timing. Due to the combination of static and dynamic skew, however, the eight signals 24 at the input to a given sampler 28 will typically be skewed relative to one another, as well as relative to the sampling timing of the sampler. Unless the skew is accounted for, any single sampling timing of sampler 28 is likely to be unsuitable for at least some of the signals. Embodiments that are described herein provide techniques for compensating for timing skew individually per signal, so as to find a single optimal sampling point for the entire octet.

In some embodiments, DRAM controller 20 comprises a bus calibration module 32 (also referred to herein as calibration circuitry or calibrator) which compensates for signal skew using techniques that are described in detail below. Bus calibration module 32 comprises multiple configurable delay elements 36. Each delay element 36 delays its respective signal 24 by a configurable time delay. Delay elements 36 are configurable individually, i.e., each delay element 36 can be configured to a different delay independently of the delays of other delay elements 36.

In some embodiments, a delay control module 40 estimates the appropriate delay for each delay element 36, and configures the delay elements accordingly. In some embodiments, bus calibration module 32 further comprises an Adaptive Delay-Locked Loop (ADLL) 44 that provides a reference time base for measuring the skews and the time delays in DRAM controller 20.

In an example embodiment, ADLL 44 provides a sequence of timing pulses (also referred to as ADLL taps or ticks) at intervals of the clock period divided by sixty-four. Each delay element 36 is configurable to thirty-two delay values, each having a delay of 8-20 pS. Thus, delay control module 40 is capable of modifying the delay of each delay element 36 over a range of 256-640 pS. The numerical values above are depicted purely by way of example, and any other suitable values can be used in alternative embodiments.

Typically, delay control module 40 evaluates the sampled signals at the output of samplers 28, and is able to decide, for each signal 24, whether the signal was sampled with a valid timing. In other words, delay control module 40 is able to decide, for each signal 24, which time delays of the corresponding delay element 36 would render the signal logic level valid and reliable. Delay control module 40 uses any suitable technique for this purpose, in an embodiment. Based on this assessment, delay control module 40 configures delay elements 36 to apply the appropriate delay to each signal 24, so as to individually compensate for the timing skew of each signal.

The configuration of DRAM controller 20 shown in FIG. 1 is a simplified example configuration that is depicted solely for the sake of conceptual clarity. In alternative embodiments, any other suitable configuration can be used. For example, the partitioning of bus calibration module 32 into modules may be performed in any other suitable manner. Some DRAM controller elements that are not mandatory for understanding of the disclosed techniques have been omitted from the figure for the sake of clarity.

The different elements of DRAM controller 20 may be implemented using dedicated hardware or firmware. Alternatively, some elements, such as delay control module 40, may be implemented using software executing on programmable hardware, or using a combination of hardware and software elements. When implementing some or all of the disclosed techniques in software on a programmable processor, the software may be downloaded to the processor in electronic form, over a network, for example, or it may, alternatively or additionally, be provided and/or stored on non-transitory tangible media, such as magnetic, optical or electronic memory.

The embodiments described herein refer mainly to data signals that are sent from the memory device to the DRAM controller, for the same of clarity. The disclosed techniques are applicable in a similar manner to data signals that are generated in the DRAM controller and sent to the memory device. Additionally or alternatively, the disclosed techniques can be implemented on the memory-device side of the bus, i.e., in the memory device and not necessarily in the DRAM controller.

Figure 2:
FIG. 2 is a diagram showing timing of multiple data-bus signals before and after applying individual time delays, in accordance with an embodiment that is described herein.
Figure 2:
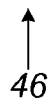

FIG. 2 is a diagram showing the timing of an octet of data (DQ) signals 24 denoted $DQ_0$ ... $DQ_7$, before and after applying individual time delays, in accordance with an embodiment that is described herein. The top of the figure shows the timing of the eight signals of the octet before delay control module 40 compensates for timing skews. The bottom of the figure shows the signal timing after compensation.

In both parts of the figure, each row represents a respective DQ signal ($DQ_0$ ... $DQ_7$). The horizontal axis is a time-delay axis, in units of ADLL ticks. A "0" value indicates that, at that particular time delay, the DQ signal is sampled properly, i.e., that the sampling timing is valid for this signal. A "1" value indicates that, at that particular time delay, the sampling timing of that DQ signal is invalid. In other words, the "0" and "1" values are "pass" and "fail" values, respectively.

As can be seen in the figure, each DQ signal in the octet has a range of delay values in which it is sampled correctly. This range is referred to herein as a "valid timing window," and is shown in the figure as a sequence of "0" values. The size and position of the valid timing window may differ from one signal to another.

At the top of the figure (before compensation), the valid timing windows are positioned at arbitrary delays, depending on the different timing skews of the different signals.

In the compensation process, delay control module 40 configures delay elements 36 to shift the valid timing windows relative to one another. As can be seen at the bottom of the figure (after compensation), all eight valid timing windows are centered on a single sampling time 46. In other words, if sampler 28 samples the entire octet at time 46, all eight signals will be valid and reliable with a large margin, notwithstanding the initial timing skews between them.

The scenario of FIG. 2 assumes that the valid timing windows of all eight signals can be centered on a single sampling point. Since the end-to-end delay range provided by elements 36 is finite, centering of this sort is not always possible. In some cases, the relative skews between signals do not enable delay control module 40 to center all eight valid timing windows on a single delay, i.e., a single valid sampling point. In some embodiments, delay control module 40 identifies and mitigates such scenarios, as well.

Figure 3:
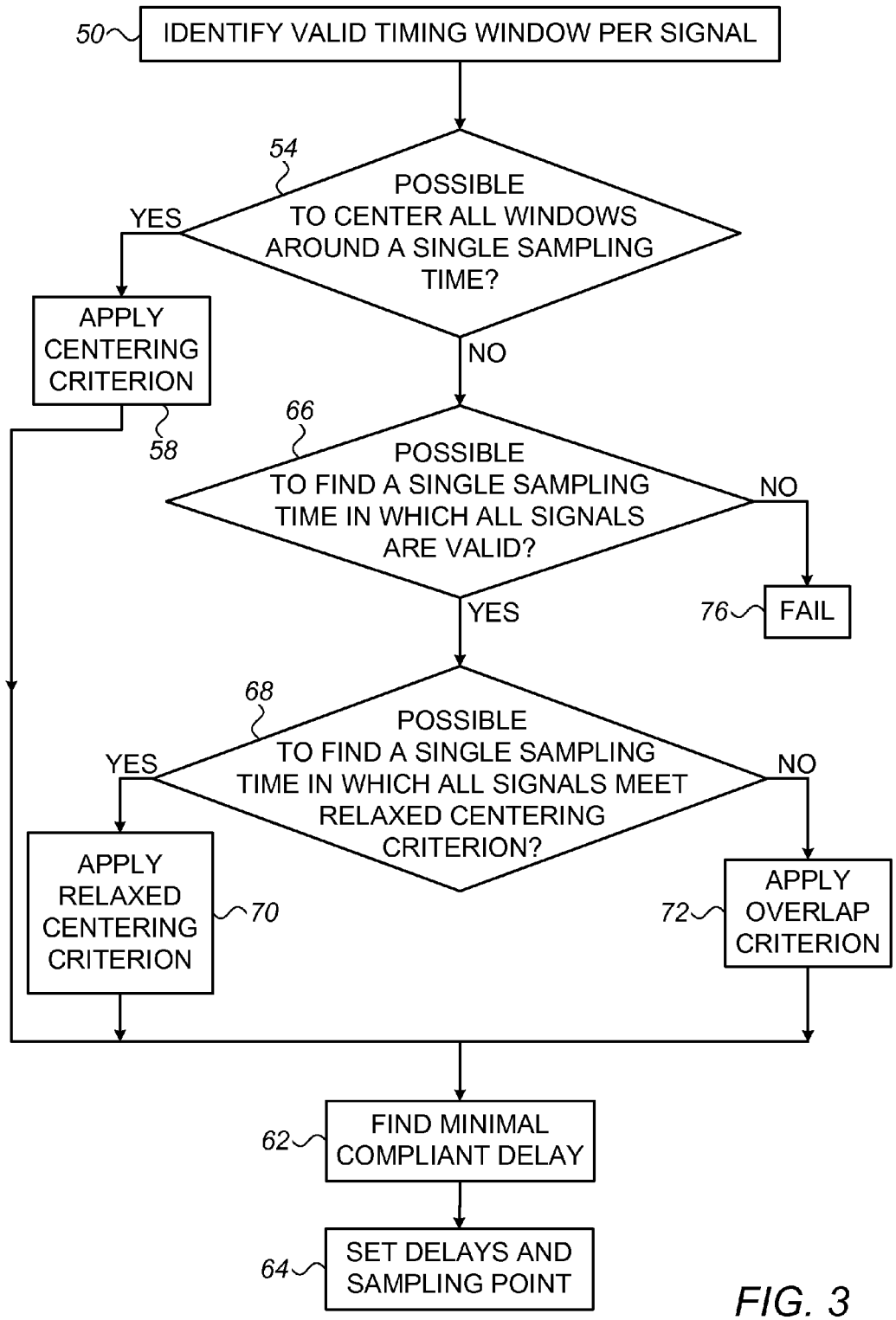
FIG. 3 is a flow chart that schematically illustrates a method for setting an optimal sampling point for multiple data-bus signals using individual time delays, in accordance with an embodiment that is described herein.

FIG. 3 is a flow chart that schematically illustrates a method for setting the optimal sampling point for an octet of data-bus signals 24 using individual time delays, in accordance with an embodiment that is described herein. In an embodiment, the method is carried out during initialization, e.g., power-up, of DRAM controller 20. Generally, however, the method may be carried out at any suitable time and/or in response to any suitable event.

The method of FIG. 3 begins with delay control module 40 identifying the valid timing windows of the various signals 24 in the octet, at a window identification operation 50. For each of the eight signals, delay control module 40 typically identifies the range ("window") of delays that, if applied to the signal, would result in valid reliable sampling. The range of delays (or, equivalently, the range of values for configuring delay element 36) is regarded as the valid timing window of the signal.

At a centering checking operation 54, delay control module 40 checks whether it is possible to align the centers of all eight valid timing windows to the same delay. This criterion is referred to as a centering criterion. In an example embodiment, delay control module 40 identifies, for each signal 24 in the octet, the range of ADLL ticks at which the center of the signal's valid timing window can be positioned (given the finite range of delays of element 36).

If the eight ranges of ADLL ticks overlap in at least one common ADLL tick, delay control module 40 concludes that it is possible to center all valid timing windows on the same sampling point. In other words, delay control module 40 finds a set of eight delays that, when applied to the respective delay elements 36, would center the valid timing windows of all eight signals on the same sampling point.

In many cases, the eight ranges of ADLL ticks will have multiple ADLL ticks in common. Delay control module 40 thus defines a set of (one or more) ADLL ticks in which the centering criterion applies, at a centering setting operation 58.

If the set of ADLL ticks in which the centering criterion applies comprises multiple ADLL ticks, it is typically preferable to select the configuration having smallest delay, in order to minimize the overall delay of bus calibration module 32. Therefore, delay control module 40 selects the smallest delay that still enables centering, at a minimal compliant delay selection operation 62.

At a setting operation 64, delay control module 40 configures delay elements 36 with the appropriate delays (the minimal delays that center the valid timing windows of all eight signals on the same sampling point). At this point the method terminates, and DRAM controller 20 is able to sample the octet of signals 24 with high signal integrity.

If, on the other hand, operation 54 concludes that centering of all valid timing windows is not possible, delay control module 40 reverts to a looser requirement, in which it attempts to identify a set of delays that, when applied to delay elements 36, would cause the valid timing windows of all eight signals to overlap a single sampling point. This criterion is also referred to herein as an "overlap criterion" (as opposed to "centering criterion").

The overlap criterion requires that the eight valid timing windows overlap (but not necessarily be centered on) a single sampling point. Delay control module 40 checks for this criterion, at an overlap checking operation 66. If the overlap criterion cannot be met, delay control module 40 concludes that the finite range of delays of elements 36 does not enable achieving a single sampling point that is valid for all eight signals in the octet. In such a case, delay control module 40 declares failure, at a failure termination operation 74, and the method terminates.

If the overlap criterion is met at operation 66, delay control module 40 checks for a "relaxed centering criterion," at a relaxed centering checking operation 68. The relaxed centering criterion is met if it is possible to identify a set of delays that, when applied to delay elements 36, would cause the valid timing windows of all eight signals to overlap at a single sampling point, while maintaining a certain time margin between the single sampling point and the edges of the valid timing windows.

If the relaxed centering criterion is met, delay control module 40 defines a set of (one or more) ADLL ticks in which the criterion applies, at a relaxed centering setting operation 70. If the relaxed centering criterion is not met, delay control module 40 defines a set of (one or more) ADLL ticks in which only the overlap criterion applies, at an overlap setting operation 72. In either case, delay control module 40 selects the minimal set of delays that still meet the criterion, at operation 62, and sets the selected delays, at operation 64.

The following description gives a formal mathematical representation of the above solution, and also describes some of the steps of FIG. 3 with greater detail. Let D denote the duration of a single ADLL tick, and let d denote the delay resolution (the delay increment) of elements 36. Let λ denote the ratio between the two delays, $\lambda=D/d$. For each signal 24 denoted $DQ_X$, $X=0, 1, \ldots, 7$, the initial delay index for configuring element 36 is denoted $\alpha_X$, $\alpha_X=0, 1, \ldots, 31$, and the delay of element 36 is thus $\alpha_X \cdot d$. The valid timing window of signal $DQ_X$ lies between ADLL ticks $L_X$ and $H_X$, i.e., between delays $D \cdot L_X$ and $D \cdot H_X$. The duration of the valid timing window of signal $DQ_X$ is $VW_X=(H_X-L_X) \cdot D$. In the present example the range of ADLL ticks is $-16 < L_X < H_X < 48$.

The valid timing window of signal $DQ_X$ is centered around ADLL tick $C_X=(H_X+L_X)/2$. The range of ADLL ticks in which the center $C_X$ of the valid timing window may be positioned (referred to herein as a "center zone") is given by:

$$C_X \in \left\{ C_X^0 - \frac{a_X}{\lambda},\; C_X^0 + \frac{(31-a_X)}{\lambda} \right\} \quad \text{Equation 1}$$

Figure 4:
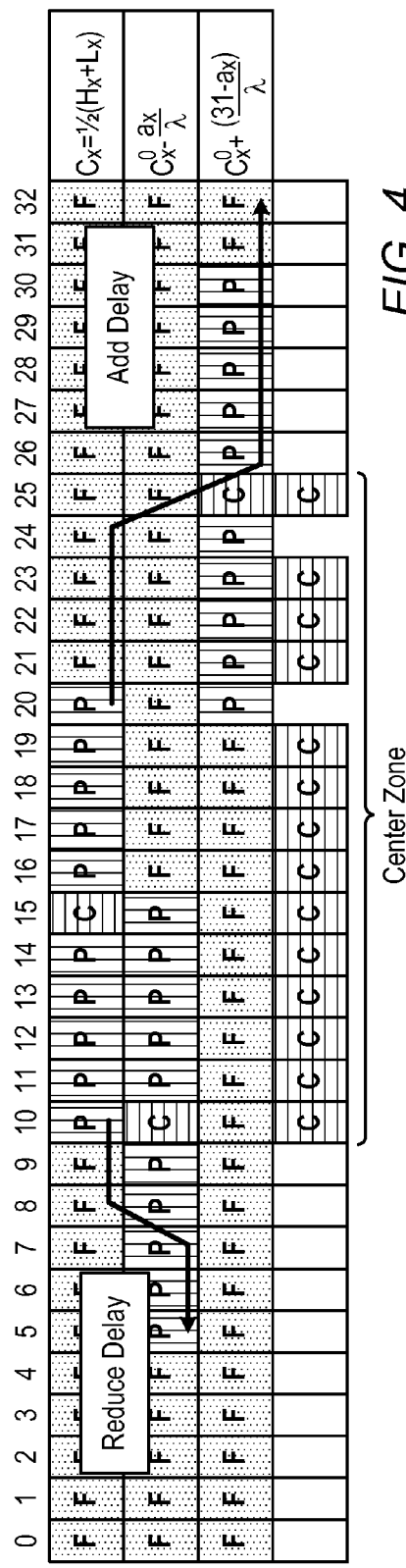
FIG. 4 is a diagram illustrating a process of finding the range of possible positions for the center of a valid timing window of a bus signal, in accordance with an embodiment that is described herein.

FIG. 4 is a diagram illustrating the process of finding the range of ADLL ticks in which the center $C_X$ of the valid timing window of signal $DQ_X$ may be positioned, in accordance with an embodiment that is described herein.

The horizontal axis of the figure denotes ADLL ticks. The first (top) row shows the position of the valid timing window, when delay element 36 of signal $DQ_X$ is set to some nominal intermediate delay. The ADLL ticks for which the signal sampling is valid are marked PASS ("P"). The ADLL ticks for which the signal sampling is invalid are marked FAIL ("F"). The center of the valid timing window is marked "C".

The second row shows the position of the valid timing window with delay element 36 set to its minimal delay. The third row shows the position of the valid timing window with delay element 36 set to its maximal delay. The fourth (bottom) row shows the center zone, i.e., the range of ADLL ticks in which it is possible to center the valid timing window by controlling delay element 36.

Figure 5:
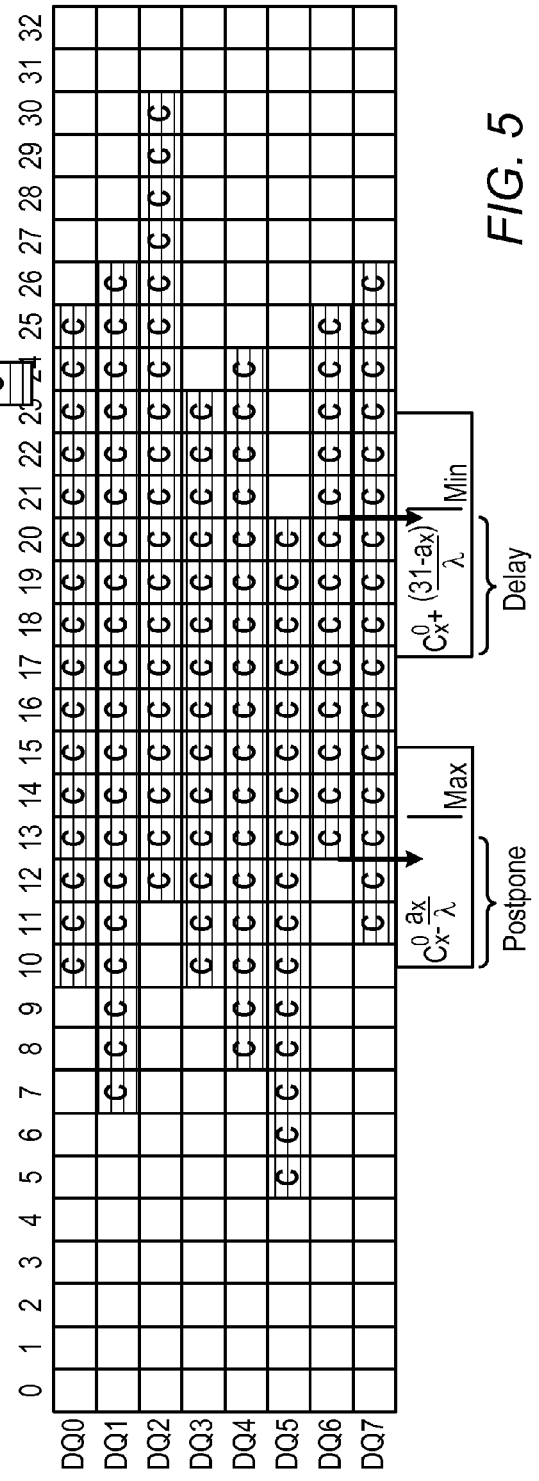
FIG. 5 is a diagram illustrating a process of centering valid timing windows of multiple data-bus signals on a single sampling point, in accordance with an embodiment that is described herein.

FIG. 5 is a diagram illustrating a process of centering the valid timing windows of the eight signals $DQ_0 \ldots DQ_7$ on a single sampling point, in accordance with an embodiment that is described herein. The horizontal axis of FIG. 5 denotes ADLL ticks. The eight rows show the eight center zones of signals $DQ_0 \ldots DQ_7$. Each center zone is determined by delay control module 40 using Equation 1 above.

In order to center all eight valid timing windows on a single sampling point, there should be at least one ADLL tick in which all eight center zones overlap. In the present example, there are eight such ADLL ticks (from tick 13 to tick 20). Any of these ticks can be used as the single sampling point for the octet. Typically, delay control module 40 would select the left-most ADLL tick, since it has the smallest delay. Alternatively, other suitable ADLL ticks among overlapping ADLL ticks can be selected.

Formally, the criterion that delay control module 40 evaluates in order to verify that it is possible to center all valid timing windows on a single sampling point is:

$$\max\left\{C_X^0 - \frac{a_X}{\lambda}\right\} < \min\left\{C_Y^0 + \frac{(31-a_Y)}{\lambda}\right\}; \quad \text{Equation 2}$$

$$0 \le X \ne Y \le 7$$

In some embodiments, delay control module 40 carries out operation 54 of FIG. 3 by (i) finding the eight center zones of the eight signals $DQ_0 \ldots DQ_7$ using the process of FIG. 4, and checking using Equation 2 whether the center zones overlap in at least one ADLL tick. If centering is possible, the optimal ADLL tick for positioning the centers of the valid timing windows is given by:

$$C_{opt} = \max\left\{C_X^0 - \frac{a_X}{\lambda}\right\}; \quad \text{Equation 3}$$

$$0 \le X \le 7$$

and the time delay to be set for the delay element 36 of signal $DQ_Y$ is $(C_{opt}-C_Y^0)\cdot\lambda$; $0 \le Y \le 7$.

As explained above, if it is impossible to center the valid timing windows of all signals on the same sampling point, delay control module 40 attempts to meet the overlap criterion, i.e., to find a single sampling point (or equivalently, a single ADLL tick) that overlaps all the valid timing windows. Equation 4 below gives the mathematical criterion evaluated for this purpose.

Figure 6:
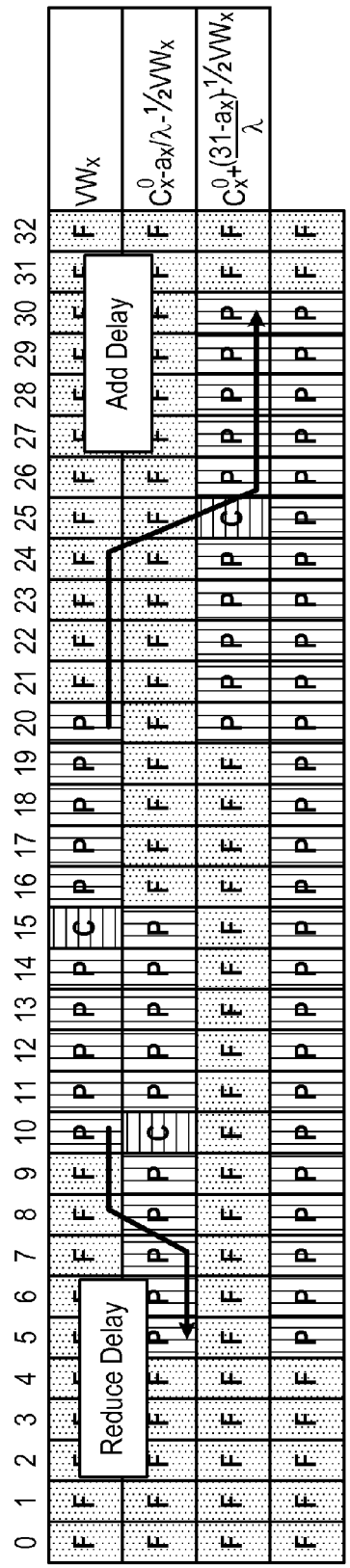
FIG. 6 is a diagram illustrating a process of finding the possible positions for a valid timing window of a bus signal, in accordance with an embodiment that is described herein.

FIG. 6 is a diagram illustrating the process of finding the possible positions of a valid timing window of a signal $DQ_X$, in accordance with an embodiment that is described herein.

The horizontal axis of the figure denotes ADLL ticks. The first (top) row shows the position of the valid timing window, when delay element 36 of signal $DQ_X$ is set to some nominal intermediate delay. The ADLL ticks for which the signal sampling is valid are marked "P", the ADLL ticks for which the signal sampling is invalid are marked "F", and the center of the valid timing window is marked "C". The second row shows the position of the valid timing window with delay element 36 set to its minimal delay. The third row shows the position of the valid timing window with delay element 36 set to its maximal delay.

The fourth (bottom) row shows the "overlap zone"—defined as the range of ADLL ticks in which it is possible to position a portion (not necessarily the center) of the valid timing window by controlling delay element 36. Naturally, this range is larger than the center zone shows in FIG. 4 above.

Formally, the criterion that module 40 evaluates in order to find a single sampling point that overlaps all valid timing windows is:

$$\max\left\{C_Y^0 - \frac{a_Y}{\lambda} - \frac{1}{2}VW_Y\right\} < \min\left\{C_X^0 + \frac{(31-a_X)}{\lambda} + \frac{1}{2}VW_{YX}\right\} \quad \text{Equation 4}$$

over all $0 \le X \ne Y \le 7$.

In some embodiments, delay control module 40 carries out operation 66 of FIG. 3 by (i) finding the eight overlap zones of the eight signals $DQ_0 \ldots DQ_7$ using the process of FIG. 6, and checking using Equation 4 whether the overlap zones overlap in at least one ADLL tick. If overlap is possible, delay control module 40 identifies the intersection between the eight overlap windows. The resulting range of ADLL ticks, referred to as an "overlap window," defines the ADLL ticks at which all valid timing windows can overlap with proper setting of delay elements 36.

In some embodiments, before reverting to the overlap criterion, delay control delay control module checks for a relaxed centering criterion (which is more relaxed than the centering criterion but more stringent than the overlap criterion). In an embodiment, delay control module 40 defines for each signal 24 an extended center zone, which is larger than the original center zone by a margin of several ADLL ticks. (As explained above, the center zone of a signal 24 is the range of ADLL ticks in which it is possible to center the valid timing window of the signal by controlling delay element 36.) Delay control module 40 calculates the margin as:

$$\text{MARGIN\_VW}_X = VW_X - VW_Y; \ 0 \le X \le 7 \quad \text{Equation 5:}$$

Departing from Equation 1 above, the extended center zone of signal $DQ_X$ is thus given by:

$$C_X \in \left\{C_X^0 - \frac{a_X}{\lambda} - \text{MARGIN\_VW}_X, \right. \quad \text{Equation 6}$$

$$\left. C_X^0 + \frac{(31-a_X)}{\lambda} + \text{MARGIN\_VW}_X\right\}$$

Departing from Equation 2 above, the criterion that delay control module 40 checks in order to verify whether the relaxed centering criterion is met (operation 68) becomes:

$$\max\left\{C_X^0 - \frac{a_X}{\lambda} - \text{MARGIN\_VW}_X\right\} < \quad \text{Equation 7}$$

$$\min\left\{C_Y^0 + \frac{(31-a_Y)}{\lambda} + \text{MARGIN\_VW}_X\right\}$$

$$0 \le X \ne Y \le 7$$

Departing from Equation 3 above, the optimal center position chosen by delay control module 40 under the relaxed centering criterion is:

$$C_{opt} = \max\left\{C_X^0 - \frac{a_X}{\lambda} - \text{MARGIN\_VW}_X\right\}; \quad \text{Equation 8}$$

$$0 \le X \le 7$$

and the time delay to be set for the delay element 36 of signal $DQ_Y$ is $(C_{opt}-C_Y^0)\cdot\lambda$; $0 \le Y \le 7$.

The criteria and equations given above are given solely by way of example. In alternative embodiments, delay control module 40 may choose the optimal delays for configuring delay elements 36 using any other suitable criterion.

In some practical scenarios, variations in supply voltage (e.g., the reference voltage of sampler 28) causes variations in the positions of the timing validity windows. These variations are often asymmetrical. Therefore, even after performing the compensation schemes of FIGS. 2-6 above, the optimal sampling timing still typically vary with voltage. In some embodiments, delay control module 40 further adjusts the single sampling timing of a given octet of signals 24, to account for timing offset variation as a function of voltage.

Figure 7:
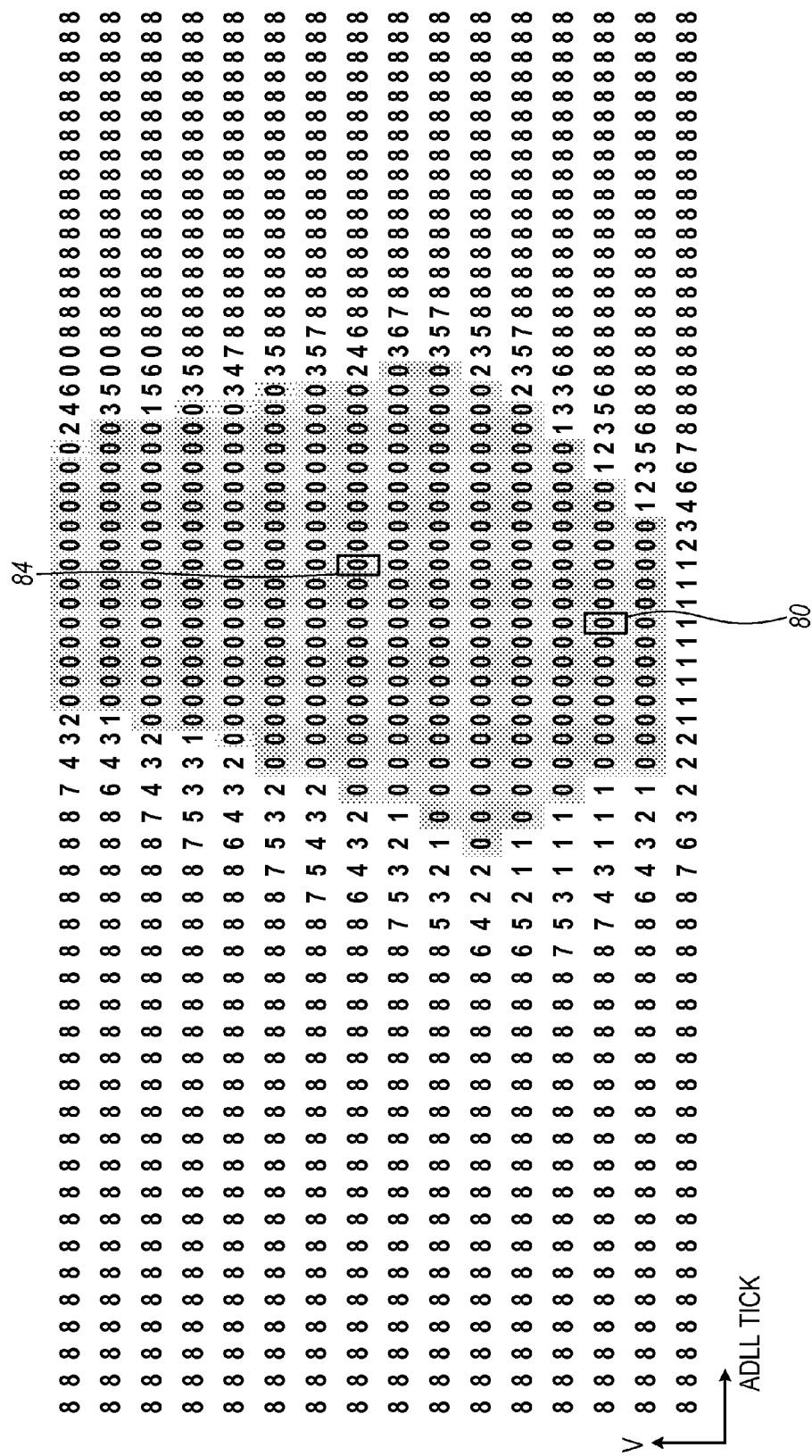
FIG. 7 is a diagram illustrating a process of compensating for voltage-dependent offsets of timing validity windows in a group of data-bus signals, in accordance with an embodiment that is described herein.

FIG. 7 is a diagram illustrating a process of compensating for voltage-dependent offsets of timing validity windows in an octet of signals 24, in accordance with an embodiment that is described herein. FIG. 7 illustrates a two-dimensional (2-D) map of the voltage-dependent variation, for an entire octet. The horizontal axis denotes time or timing offset, in units of ADLL ticks. The vertical axis denotes supply voltage (e.g., reference voltage of sampler 28 that samples the octet). It is noted that the map shows the residual voltage-dependent offsets, after applying the compensation scheme of FIGS. 2-6 above at each voltage.

The numerical value in each cell of the map gives the number of signals in the octet that were sampled incorrectly at the respective voltage and timing delay. The region of cells having a value of "0" correspond to the voltage-timing combinations that result in correct sampling of the entire octet. Higher values indicate that one or more of the signals in the octet were not sampled correctly. At the opposite extreme, the cells having a value of "8" correspond to voltage-timing combinations in which sampler 28 fails to sample all eight signals in the octet.

As can be seen in the figure, even after compensating for skew using the methods of FIGS. 2-6 above, the optimal sampling point still differs from one voltage to another. For example, a point 80 shows a sampling point that is optimal for a specific voltage (row of the map). It is evident from the figure that this sampling timing will not be optimal for other voltages.

In some embodiments, delay control module 40 calculates the optimal sampling point for the octet by finding the centroid ("center-of-mass") of the 2-D region of the map in which the entire octet was sampled correctly.

In this embodiment, delay control module 40 finds the 2-D region in the voltage-timing map in which all eight signals are sampled correctly (the region of cells having "0" values). Delay control module then calculates the centroid of this 2-D region, and sets the single sampling point to the timing offset of the centroid. A point 84 shows the sampling point set using the centroid-based scheme. As can be seen in the figure, this sampling point is optimal over the entire range of voltages.

In the example of FIG. 7, delay control module 40 calculates the centroid of the 2-D voltage-timing region in which all signals were sampled correctly. More generally, in some embodiments delay control module 40 sets the optimal sampling point by calculating the centroid of the 2-D voltage-timing region in which at least a predefined number of signals (but not necessarily all signals) were sampled correctly.

Although the embodiments described herein mainly address DDR4 SDRAM, the methods and systems described herein can also be used in other interfaces, such as in SDRAM LPDDR4, RLDRAM3 and SRAM, for example.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method, comprising:
receiving a group of logic signals to be sampled at a common sampling timing;
selecting for the logic signals in the group respective individual time delays, which individually align each of the logic signals to the common sampling timing, by:
identifying for each logic signal a respective timing window during which the logic signal is valid; and
choosing the common sampling timing and the individual time delays such that the timing windows overlap the common sampling timing;
delaying each of the logic signals by the respective selected individual time delay; and
sampling the entire group of the delayed logic signals at the common sampling timing.

2. The method according to claim 1, wherein selecting the individual time delays comprises centering each of the timing windows on the common sampling timing.

3. The method according to claim 1, wherein selecting the individual time delays comprises, in response to detecting that it is impossible to center all the timing windows on the common sampling timing, choosing the common sampling timing and the individual time delays such that the common sampling timing is separated from edges of the timing windows by at least a predefined time margin.

4. The method according to claim 1, wherein delaying the logic signals is performed by configurable delay elements having a finite delay range, and wherein selecting the individual time delays comprises ascertaining that the individual time delays are all within the finite delay range.

5. The method according to claim 1, wherein receiving the logic signals comprises receiving data (DQ) signals from a memory device.

6. The method according to claim 5, wherein receiving the logic signals comprises receiving at least one data strobe (DQS) signal from the memory device.

7. A method, comprising:
receiving a group of logic signals to be sampled at a common sampling timing;
selecting for the logic signals in the group respective individual time delays, which individually align each of the logic signals to the common sampling timing, by:
identifying, for a set of possible supply voltages, respective timing windows during which at least a predefined number of the logic signals are valid; and
setting the individual time delays so as to position the common sampling timing at a centroid of a two-dimensional region formed by the timing windows in a voltage-timing plane;
delaying each of the logic signals by the respective selected individual time delay; and
sampling the entire group of the delayed logic signals at the common sampling timing.

8. Apparatus, comprising:
a calibrator, configured to:
receive a group of logic signals to be sampled at a common sampling timing;
select for the logic signals in the group respective individual time delays that individually align each of the logic signals to the common sampling timing, by (i) identifying for each logic signal a respective timing window during which the logic signal is valid, and (ii) choosing the common sampling timing and the individual time delays such that the timing windows overlap the common sampling timing; and delay each of the logic signals by the respective selected individual time delay; and a sampler, configured to sample the entire group of the delayed logic signals at the common sampling timing.

9. The apparatus according to claim 8, wherein the calibrator is configured to select the individual time delays so as to center each of the timing windows on the common sampling timing.

10. The apparatus according to claim 8, wherein, in response to detecting that it is impossible to center all the timing windows on the common sampling timing, the calibrator is configured to choose the common sampling timing and the individual time delays such that the common sampling timing is separated from edges of the timing windows by at least a predefined time margin.

11. The apparatus according to claim 8, wherein the calibrator comprises configurable delay elements that are configured to delay the logic signals and have a finite delay range, and wherein the calibrator is configured to ascertain that the individual time delays are all within the finite delay range.

12. The apparatus according to claim 8, wherein the logic signals comprise data (DQ) signals received from a memory device.

13. The apparatus according to claim 12, wherein the logic signals comprise at least one data strobe (DQS) signal from the memory device.

14. Apparatus, comprising:

a calibrator, configured to:

receive a group of logic signals to be sampled at a common sampling timing;

select for the logic signals in the group respective individual time delays that individually align each of the logic signals to the common sampling timing, by:

identifying, for a set of possible supply voltages, respective timing windows during which at least a predefined number of the logic signals are valid; and setting the individual time delays so as to position the common sampling timing at a centroid of a two-dimensional region formed by the timing windows in a voltage-timing plane; and delay each of the logic signals by the respective selected individual time delay; and a sampler, configured to sample the entire group of the delayed logic signals at the common sampling timing.

\* \* \* \* \*